(12) United States Patent
Seta

(10) Patent No.: US 9,041,134 B2
(45) Date of Patent: May 26, 2015

(54) SOLID-STATE IMAGING DEVICE

(71) Applicant: Kabushiki Kaisha Toshiba, Tokyo (JP)

(72) Inventor: Shoji Seta, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/016,003

(22) Filed: Aug. 30, 2013

(65) Prior Publication Data

US 2014/0284745 A1    Sep. 25, 2014

(30) Foreign Application Priority Data

Mar. 25, 2013 (JP) .................. 2013-061853

(51) Int. Cl.
*H01L 29/66* (2006.01)
*H01L 27/146* (2006.01)

(52) U.S. Cl.
CPC ...... *H01L 27/1464* (2013.01); *H01L 27/14623* (2013.01); *H01L 27/14636* (2013.01); *H01L 27/14661* (2013.01); *H01L 27/1469* (2013.01)

(58) Field of Classification Search
CPC .............. H01L 27/14647; H01L 27/14652; H01L 27/14812; H01L 27/3248

USPC .......................................................... 257/432
See application file for complete search history.

(56) References Cited

U.S. PATENT DOCUMENTS

| 2010/0238331 A1* | 9/2010 | Umebayashi et al. ........ 348/294 |
| 2011/0234830 A1 | 9/2011 | Kiyota et al. |
| 2012/0105696 A1 | 5/2012 | Maeda |

FOREIGN PATENT DOCUMENTS

| JP | 2011 204797 A | 10/2011 |
| JP | 2012-094720 | 5/2012 |
| JP | 2012 094720 A | 5/2012 |

* cited by examiner

*Primary Examiner* — Elias M Ullah
(74) *Attorney, Agent, or Firm* — Patterson & Sheridan, LLP

(57) ABSTRACT

A solid-state imaging device includes a pixel chip, a logic chip and one or more shielding layers. The one or more shielding layers are arranged between or within the pixel chip and/or the logic chip to shield or reduce the effect of electromagnetic interference, radiation generated noise, or electromagnetic waves generated in one portion of the solid-state imaging device from affecting another portion of the solid-state imaging device.

18 Claims, 12 Drawing Sheets

SOLID-STATE IMAGING DEVICE

CROSS-REFERENCE TO RELATED APPLICATION

This application is based upon and claims the benefit of priority from Japanese Patent Application No. 2013-061853, filed Mar. 25, 2013, the entire contents of which are incorporated herein by reference.

FIELD

Embodiments described herein relate to a backside illumination type solid-state imaging device.

BACKGROUND

In recent years, backside illumination type solid-state imaging devices (camera module), which are typically formed in a laminated chip configuration, have been developed. These types of devices typically include an imaging element (hereinafter, described as pixel chip) and a logic circuit (hereinafter, described as logic chip). The configuration of these backside illumination type solid-state imaging devices is very effective in allowing a small solid-state imaging device to be formed.

However, due to their small size, when a high speed signal is processed by the logic portion of the device, radiation type noise (EMI: Electromagnetic Interference) typically is created by the processing circuits in the device. The EMI radiation creates noise in the signal processing of the data received from a pixel portion in the pixel chip, which influences the processed image signal. The higher an integration degree of wiring in the logic circuit, or the more complex the logic circuits are in the device, the larger the influence that the generated EMI will have on the processed data.

Therefore, there is a need for a solid-state imaging device, and method of forming such a device, that is less affected by various types of electrical interference.

DETAILED DESCRIPTION

Figure 1A:
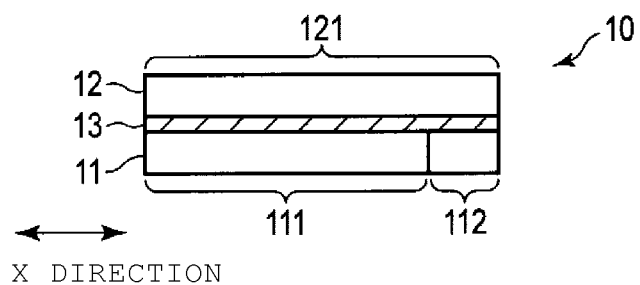
FIGS. 1A to 1C are diagrams which schematically illustrate a solid-state imaging device according to a first embodiment.

Embodiments provide a solid-state imaging device which is able to reduce the affect of noise disturbances on an image signal.

In general, according to one embodiment, a solid-state imaging device includes a semiconductor substrate, a transistor, a first interlayer insulation film, a first multilayered wiring layer, a shield layer, a second interlayer insulation film, a second multilayered wiring layer, a semiconductor layer, an imaging element, and a color filter. The transistor is formed on the semiconductor substrate. The first interlayer insulation film is formed on the semiconductor substrate. The first multilayered wiring layer is formed in the first interlayer insulation film. The shield layer is formed in the first interlayer insulation film. The second interlayer insulation film is formed on the first interlayer insulation film. The second multilayered wiring layer is formed in the second interlayer insulation film. The semiconductor layer is formed on the second interlayer insulation film. The imaging element is formed in the semiconductor layer, and on an interface of the second interlayer insulation film. The color filter is formed on the semiconductor layer.

Hereinafter, a solid-state imaging device (sensor chip) according to embodiments will be described with reference to the drawings. In the following descriptions, elements having the same function and configuration will be given the same reference numerals, and repeated descriptions will be made only when necessary.

(First Embodiment)

A solid-state imaging device according to a first embodiment will be described.

Figure 1B:
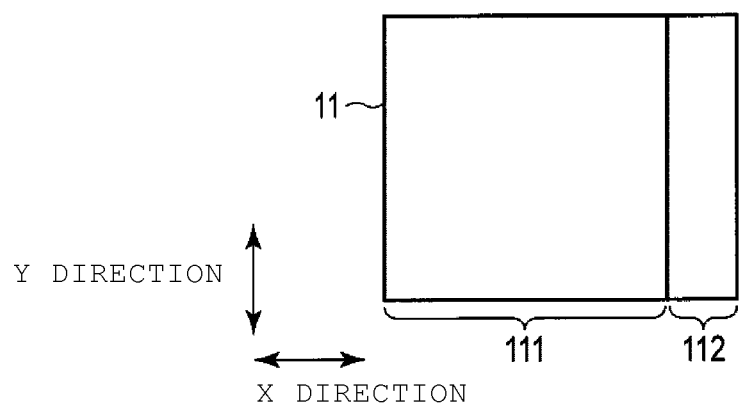
Figure 1C:
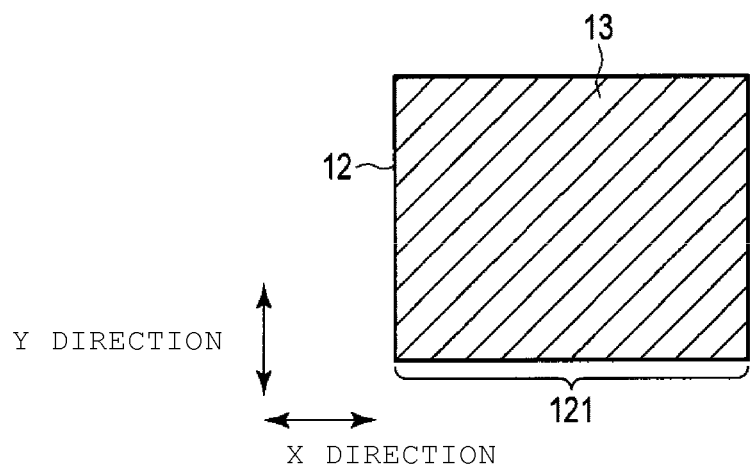

FIGS. 1A to 1C are diagrams which schematically illustrate the solid-state imaging device according to the first embodiment. FIG. 1A illustrates a cross-sectional view of the solid-state imaging device, FIG. 1B illustrates a plan view of a pixel chip, and FIG. 1C illustrates a plan view of a logic chip. The cross-sectional view which is illustrated in FIG. 1A illustrates a cross section which is aligned along the X direction.

As illustrated in FIG. 1A, a solid-state imaging device 10 is formed by forming a laminated chip in which a pixel chip 11 and a logic chip 12 are laminated or joined to form a single device structure. A shield layer 13 is arranged between the pixel chip 11 and the logic chip 12. In other words, the pixel chip 11 and the logic chip 12 are bonded together, and the shield layer 13 is formed at the bonded surface (interface) of the pixel chip 11 and the logic chip 12. In addition, an arrangement of the shield layer 13 is not limited to the bonded surface, and may be arranged inside of the bonded surface, that is, in an interlayer insulation layer of the pixel chip 11, and may be arranged in an interlayer insulation layer of the logic chip 12.

The pixel chip 11 mainly includes a pixel region 111 and an analog-digital conversion circuit (hereinafter, described as ADC) region 112. An imaging element (or photoelectric conversion element) which converts input light into an electric signal, for example, a plurality of photo diodes are arranged in a matrix in the pixel region 111. In addition, a readout circuit (for example, read-gate transistor, amplifier transistor, or the like) which reads and transmits a signal which is performed with photoelectric conversion in the imaging element is formed in the pixel region 111. An analog-digital conversion circuit (ADC) which converts an analog signal which is output from the readout circuit into a digital signal is formed in the ADC region 112.

In addition, the logic chip 12 mainly includes a logic circuit region 121. A logic circuit which processes an image signal which is output from the ADC is formed in the logic circuit region 121.

The shield layer 13 is formed of a metal film, for example, aluminum, copper, or the like. The shield layer 13 shields or reduces the transmission of radiation noise, or electromagnetic waves which are generated by the logic circuit, through the shield layer 13. The shield layer 13 may be formed by an insulation film, for example, a silicon compound (silicon oxide film, silicon nitride film, organic silicon oxide film, silicon carbide), a sheet including an amount of metal in a film layer that has a low dielectric constant (Low-k film), or the like, that can shield or reduce the radiation noise, or the electromagnetic waves, passing therethrough.

Subsequently, the solid-state imaging device according to the first embodiment, that is, the laminated chip in which the pixel chip 11 and the logic chip 12 are bonded will be described.

Figure 2:
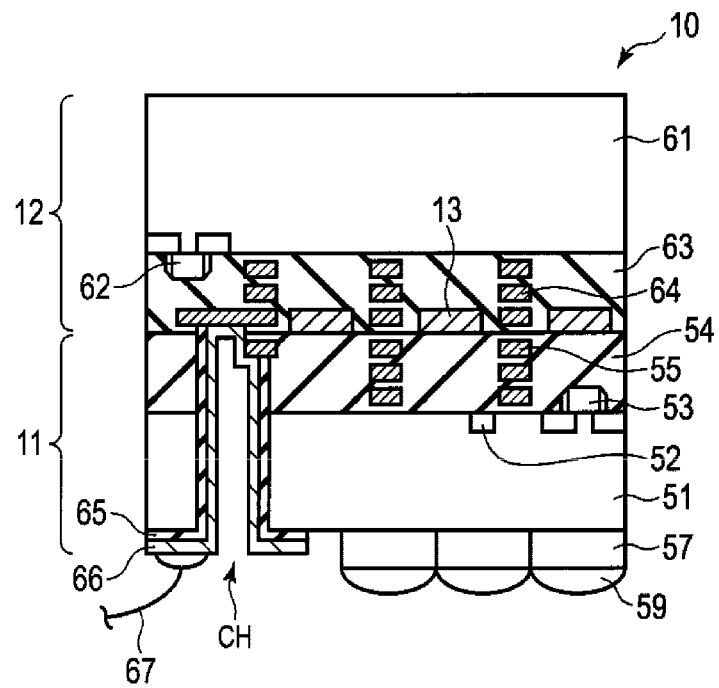
FIG. 2 is a cross-sectional view which illustrates a structure of the solid-state imaging device according to the first embodiment.

FIG. 2 is a cross-sectional view which illustrates a structure of the solid-state imaging device according to a first embodiment.

As illustrated, the solid-state imaging device 10 has a structure in which the pixel chip 11 and the logic chip 12 are formed and then bonded together.

First, a cross-sectional structure of the pixel chip 11 will be described. An imaging element 52, a read-gate transistor 53 which configures the readout circuit, and the like are formed on the first main surface of a p-type silicon epitaxial layer 51. An interlayer insulation film 54 is formed on the first main surface of the epitaxial layer 51. A wiring layer 55 is formed in the interlayer insulation film 54.

A color filter 57 is formed on the second main surface which faces the first main surface of the epitaxial layer 51. The color filter 57 is arranged so as to correspond to the imaging element 52, and is formed by a red (R), green (G), or blue (B) filter. A microlens 59 is formed on the color filter 57. The microlens 59 is arranged so as to correspond to the color filter 57. A thin insulation film may be formed between the epitaxial layer 51 and the color filter 57, and between the color filter 57 and the microlens 59.

The cross-sectional structure of the logic chip 12 will now be described. A transistor 62, which is part of a logic circuit, is formed on the first main surface of the silicon semiconductor substrate 61. An interlayer insulation film 63 is formed on the first main surface of the semiconductor substrate 61. A multilayered wiring layer 64 is formed in the interlayer insulation film 63. In addition, the shield layer 13 is formed between the multilayered wiring layers 64. The shield layer 13 is arranged at an interface at which the pixel chip 11 and the logic chip 12 are bonded. In one configuration, the shield layer 13 is arranged at the interface on which the interlayer insulation film 54 and the interlayer insulation film 63 are bonded. In addition, wiring vias are formed between the multilayered wiring layers 64 which are arranged on different wiring layers, however, the wiring vias have been omitted in FIGS. 2 to 7.

In addition, a penetration electrode CH is formed in the pixel chip 11. The penetration electrode CH has the following structure. A hole is formed in the epitaxial layer 51 and the interlayer insulation film 54, and an insulation film 65 and a conductive film 66 are formed in the hole. The conductive film 66 is electrically connected to the multilayered wiring layer 64 of the logic chip 12.

A wire 67 is bonded to the penetration electrode CH. The penetration electrode CH is electrically connected to the multilayered wiring layer 64 of the logic chip 12, and the wire 67.

In the solid-state imaging device according to the first embodiment, the shield layer 13 is arranged between the logic circuit including the transistor 62 and the readout circuit including the imaging element 52, and the read-gate transistor 53. By use of this configuration, it is possible to reduce the noise disturbance which affects the imaging element 52 in the pixel chip 11 and the readout circuit, by shielding or reducing the radiation noise, or the electromagnetic waves which are created in the logic circuit.

Subsequently, a manufacturing method of the solid-state imaging device according to the first embodiment will be described.

FIGS. 3 to 7 are cross-sectional views which illustrate the manufacturing method of the solid-state imaging device according to the first embodiment.

Figure 3:
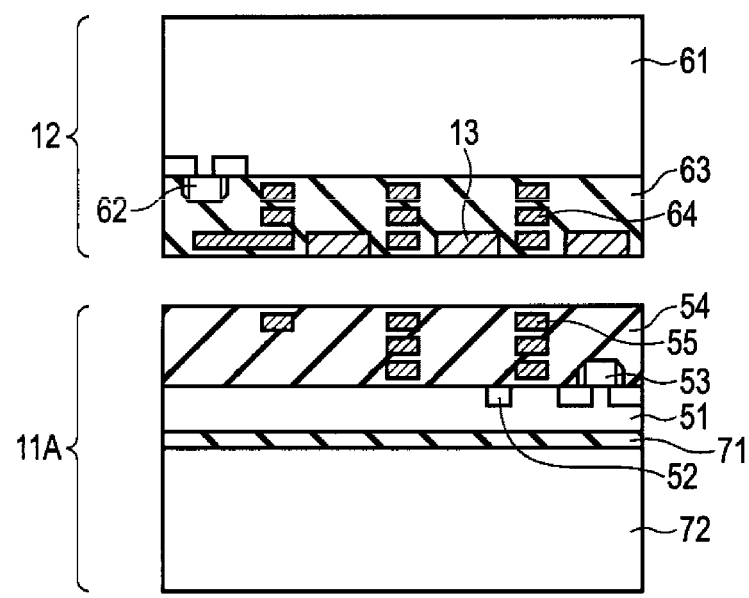
FIG. 3 is a cross-sectional view which illustrates part of a manufacturing method that is used to form the solid-state imaging device according to the first embodiment.

FIG. 3 illustrates a cross-sectional view of the pixel chip and the logic chip before bonding.

First, as illustrated in FIG. 3, a pixel chip 11A and the logic chip 12 are prepared. Since the structure of the logic chip 12 is the same as the structure which is illustrated in FIG. 2, descriptions thereof will be omitted.

A cross-sectional structure of the pixel chip 11A will be described below. Elements such as the imaging element 52, the read-gate transistor 53, and the like are formed on the first main surface of an SOI substrate which includes a semiconductor substrate 72, an insulation film 71, and the epitaxial layer 51. In addition, the interlayer insulation film 54 is formed on the epitaxial layer 51, and a multilayered wiring layer 55 is formed in the interlayer insulation film 54.

Figure 4:
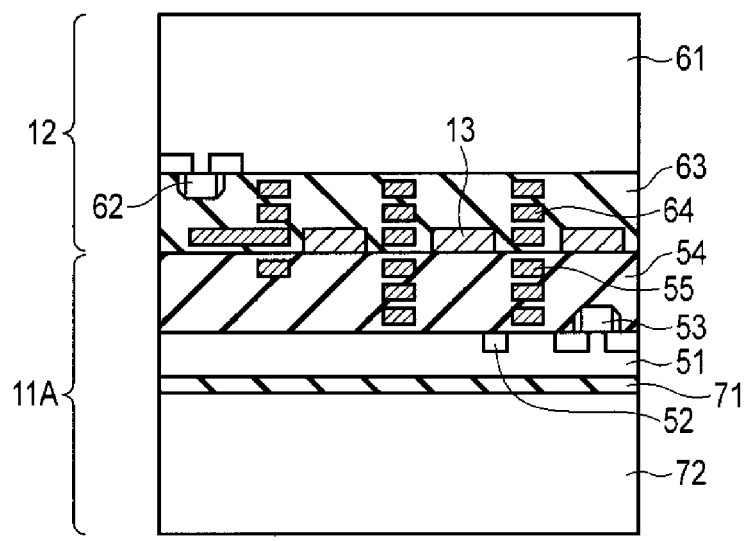
FIG. 4 is a cross-sectional view which illustrates the manufacturing method of the solid-state imaging device according to the first embodiment.

Subsequently, the pixel chip 11A and the logic chip 12 are bonded so that the interlayer insulation film 54 and the interlayer insulation film 63 face each other, as illustrated in FIG. 4.

Figure 5:
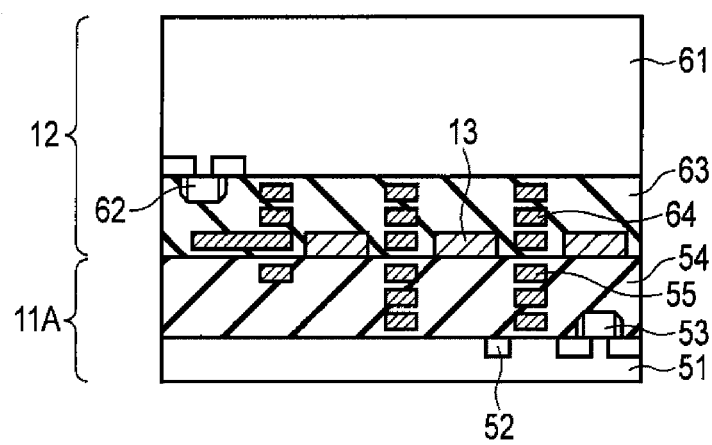
FIG. 5 is a cross-sectional view which illustrates the manufacturing method of the solid-state imaging device according to the first embodiment.

Thereafter, the semiconductor substrate 72 of the pixel chip 11A is removed using, for example, a Reactive Ion Etching (RIE) process. In addition, the insulation film 71 on the second main surface of the epitaxial layer 51 is removed using the RIE process, as illustrated in FIG. 5.

Figure 6:
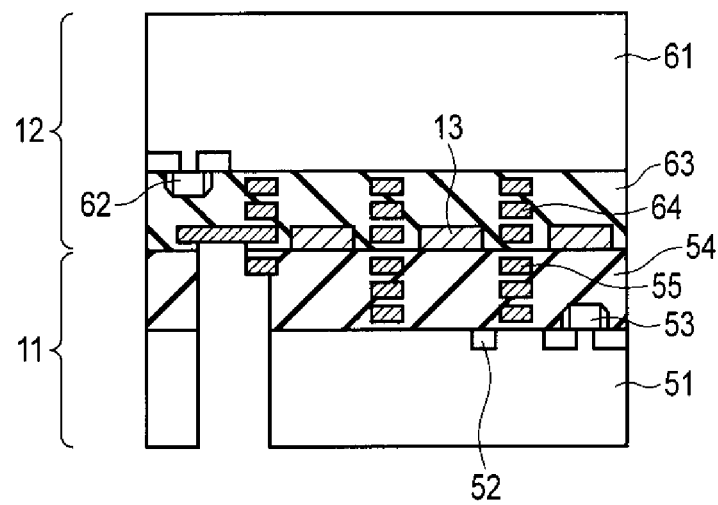
FIG. 6 is a cross-sectional view which illustrates the manufacturing method of the solid-state imaging device according to the first embodiment.

Subsequently, as illustrated in FIG. 6, an epitaxial layer 51 is grown on the original epitaxial layer 51 using an epitaxial growth method. In addition, a contact hole is formed in the epitaxial layer 51, and the interlayer insulation film 54.

Figure 7:
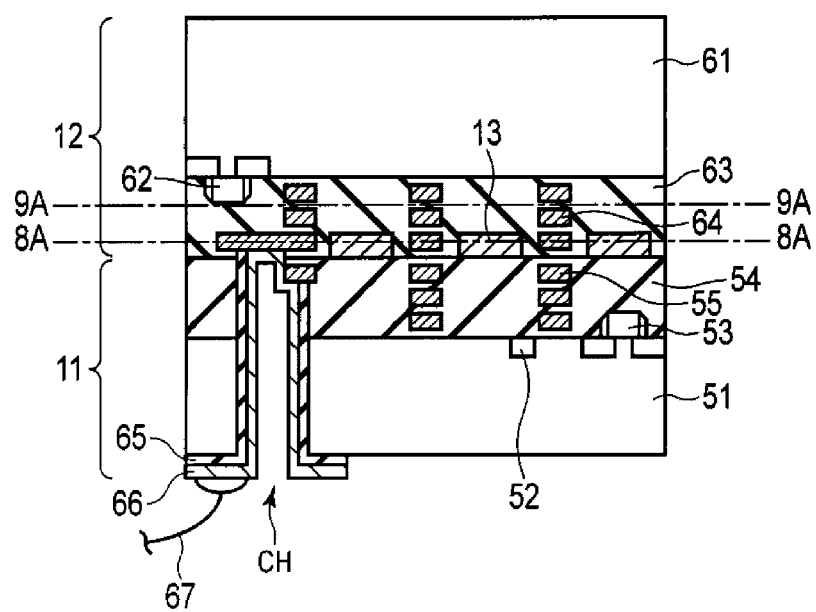
FIG. 7 is a cross-sectional view which illustrates the manufacturing method of the solid-state imaging device according to the first embodiment.

Thereafter, as illustrated in FIG. 7, the insulation film 65 is formed in the contact hole, an insulation layer on the multi-layered wiring layer 64 is removed, and then, the penetration electrode CH is formed by further depositing the conductive film 66 in the contact hole. In addition, the wire 67 is bonded onto the conductive film 66.

Subsequently, as illustrated in FIG. 2, the color filter 57 is formed on the epitaxial layer 51 so as to correspond to the imaging element 52. The microlens 59 is formed on the color filter 57. The microlens 59 is arranged so as to align with the color filter 57.

Subsequently, a layout of the shield layer 13 which is formed in the solid-state imaging device 10 will be described in detail.

Figure 8:
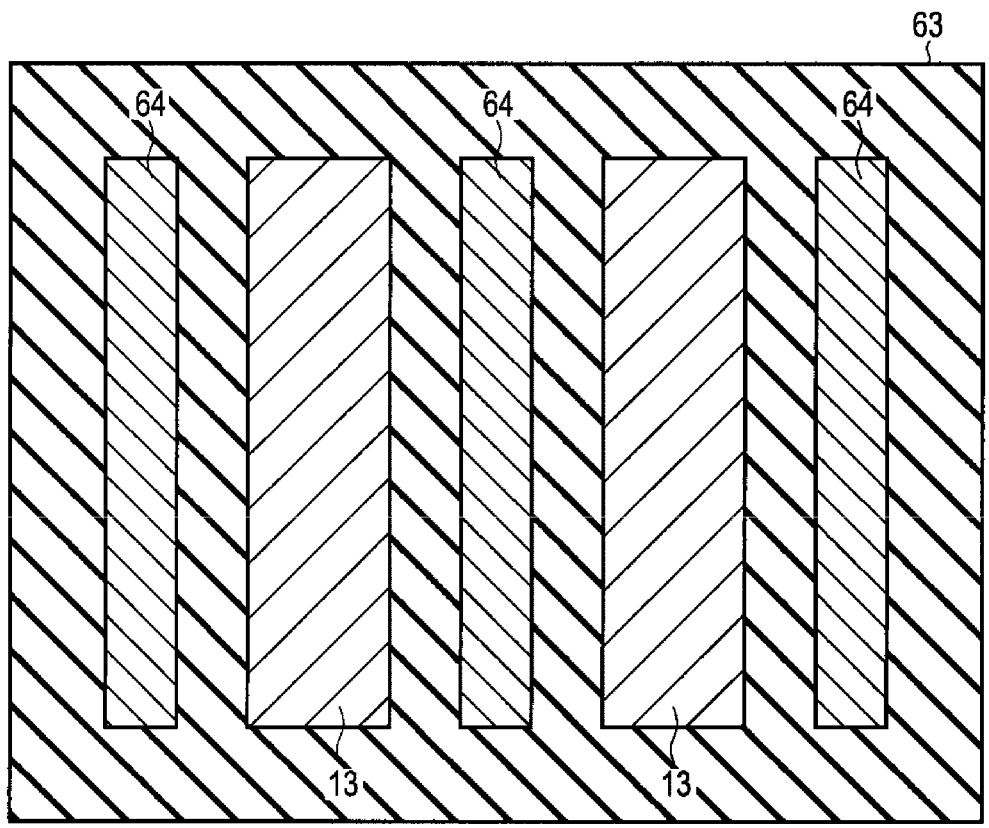
FIG. 8 is a cross-sectional plan view which illustrates an example of a layout of a shield layer of the solid-state imaging device according to the first embodiment.

FIG. 8 is a plan cross-sectional view which is cut along line 8A-8A in FIG. 7, and is an example in which the shield layer 13 is formed between wirings of the multilayered wiring layer 64.

The shield layer 13 is arranged between the multilayered wiring layers 64 as illustrated in FIG. 8. Due to this, the shield layer 13 shields or reduces the radiation noise or the electromagnetic waves which occur from the logic circuit in the logic chip 12 from affecting the imaging elements in the device.

Figure 9:
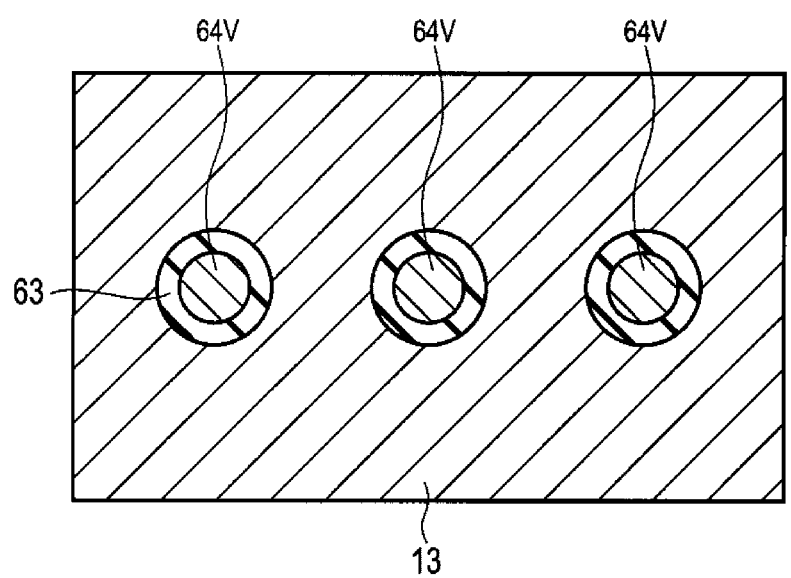
FIG. 9 is a cross-sectional plan view which illustrates another example of the layout of the shield layer of the solid-state imaging device according to the first embodiment.

FIG. 9 is a plan view which is cut along line 9A-9A in FIG. 7, and an example in which the shield layer 13 is formed between wiring vias of the multilayered wiring layer 64.

The shield layer 13 is arranged to cover all regions of the device except for the wiring vias 64V, as illustrated in FIG. 9. Due to this, the shield layer 13 shields or reduces the radiation noise or the electromagnetic waves which emanate from the logic circuit in the logic chip 12.

Figure 10:
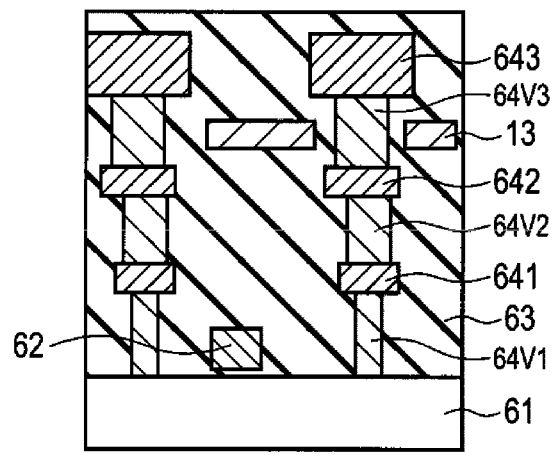
FIG. 10 is a side cross-sectional view of an example of a logic chip of the solid-state imaging device according to the first embodiment.

FIG. 10 is a cross-sectional view illustrating a shield layer that is formed around and/or between the wiring vias of the multilayered wiring layer 64 in the interlayer insulation film 63 of the logic chip 12.

As illustrated in FIG. 10, the transistor 62 which configures the logic circuit is formed in the semiconductor substrate 61. The interlayer insulation film 63 is formed on the semiconductor substrate 61. A wiring via 64V1, a wiring layer 641, a wiring via 64V2, a wiring layer 642, a wiring via 64V3, and a wiring layer 643 are formed in order from the semiconductor substrate 61 side in the interlayer insulation film 63. In addition, the shield layer 13 is formed in a layer of which the height from the semiconductor substrate 61 is approximately the same as that of the wiring via 64V3, in the interlayer insulation film 63. The shield layer 13 is arranged in a region that extends laterally across the substrate except for a region surrounding the wiring via 64V3.

Hereinafter, a manufacturing method of a structure which is illustrated in FIG. 10 will be described.

FIGS. 11A to 11C and FIGS. 12A to 12C are cross-sectional views which illustrate a process for manufacturing the structure which is illustrated in FIG. 10. In addition, here, the structure below the wiring layer 642 is omitted. In addition, a plurality of interlayer insulation films which configure the interlayer insulation film 63 are denoted by 631, 632, and 633.

Figure 11A:
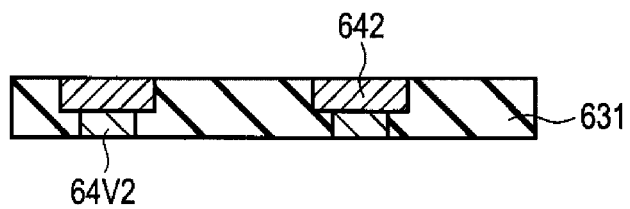
FIGS. 11A to 11C are side cross-sectional views which illustrate parts of a manufacturing method of forming the structure illustrated in FIG. 10 according to an embodiment of the invention.
Figure 11B:
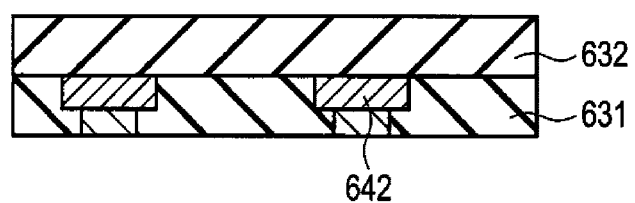

First, as illustrated in FIG. 11A, a patterned wiring layer 642 is formed on the interlayer insulation film 631. Subsequently, as illustrated in FIG. 11B, the interlayer insulation film 632 is formed on the interlayer insulation film 631 and the wiring layer 642.

Figure 11C:
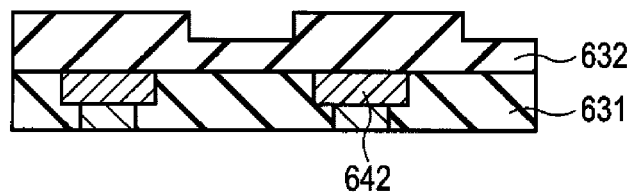

Thereafter, as illustrated in FIG. 11C, the interlayer insulation film 632 is etched using a photolithography method, or the like, and a groove for forming the shield layer 13 is formed.

Figure 12A:
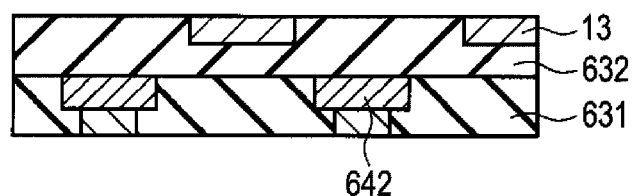
FIGS. 12A to 12C are side cross-sectional views which illustrate parts of the manufacturing method of the structure illustrated in FIG. 10 according to an embodiment of the invention.
Figure 12B:
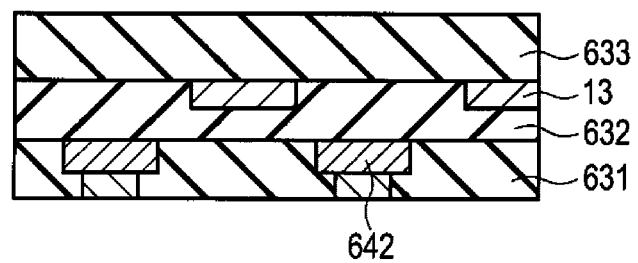
Figure 12C:
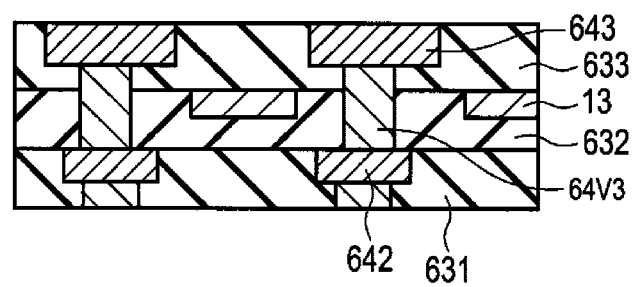

Subsequently, as illustrated in FIG. 12A, the shield layer 13 is buried in the groove of the interlayer insulation film 632. Thereafter, as illustrated in FIG. 12B, the interlayer insulation film 633 is formed on the interlayer insulation film 632 and the shield layer 13. Subsequently, as illustrated in FIG. 12C, the wiring 643 and the wiring via 64V3 are formed using a dual damascene wiring method on the interlayer insulation films 632 and 633. In this manner, the structure which is illustrated in FIG. 10 can be formed using semiconductor processing techniques.

Subsequently, a modification example of the solid-state imaging device according to the first embodiment will be described.

Figure 13:
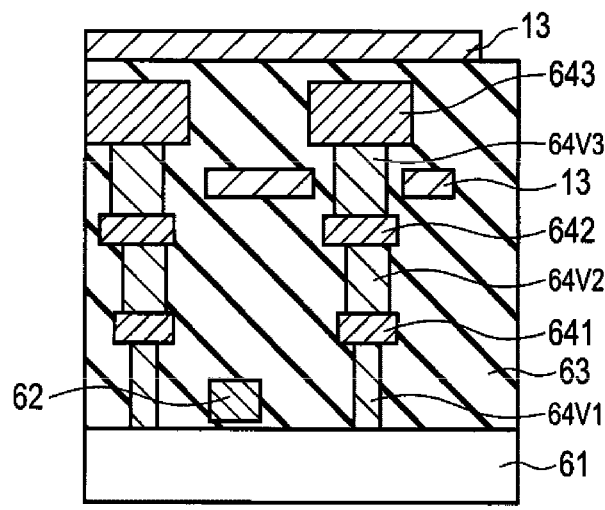
FIG. 13 is a side cross-sectional view of a logic chip of a solid-state imaging device as a modification example of the first embodiment.

A plurality of shield layers may be formed in the solid-state imaging device. FIG. 13 illustrates a modified example of the first embodiment, which includes a shield layer that is formed on the surface of the interlayer insulation film 63 of the logic chip 12. When the plurality of shield layers 13 are formed in this manner, it is possible to further shield or reduce the effect of the generated radiation noise, or the electromagnetic waves, on the pixel chip 11 from the logic circuits.

Figure 14:
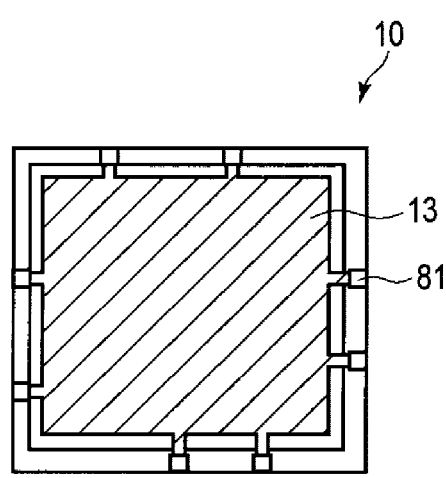
FIG. 14 is a plan cross-sectional view which illustrates a shield layer and a pad in a modified example of the first embodiment.

In addition, as illustrated in FIG. 14, the shield layer 13 may be connected to a grounding pad 81, and a grounding potential may be supplied to the shield layer 13. The connection between the shield layer 13 and the grounding pad 81 may be performed using wiring.

In this configuration, no potential difference is created between the ground potential and the wiring, and thus it is possible to reduce an amount of induced current in the shield layer 13. In addition, immunity from noise, for example Electro Magnetic Interference (EMI) noise or Electro Magnetic Susceptibility (EMS) noise, becomes stronger, and it is possible to further shield or reduce the effect of radiation noise, or the effect of any electromagnetic waves. As a result, it is possible to reduce the noise disturbance which affects the imaging element 52 in the pixel chip 11 and the readout circuit, and to improve pixel characteristics in the solid-state imaging device.

In addition, the shield layer 13 may be connected to another potential pad, and the shield layer 13 may be supplied with another fixed potential, for example, a power supply voltage VDD, or a potential between the ground potential and the power supply voltage VDD. In addition, the potential which is supplied to the shield layer 13 may be frequently changed, as necessary.

As described above, according to the first embodiment, it is possible to shield or reduce the radiation noise, or the electromagnetic waves which occur from the logic circuit, by covering almost the entire region of the logic circuit using the shield layer. In this manner, it is possible to prevent the noise disturbance from affecting the image signal which is generated in the pixel chip.

(Second Embodiment)

A solid-state imaging device according to a second embodiment will be described. According to the first embodiment, the shield layer is formed on almost the entire surface of the logic circuit region 121, however, according to the second embodiment, the shield layer 13 is formed only on a pixel region 111. The same configuration as that in the first embodiment is given the same reference numerals, and descriptions thereof will be omitted.

Figure 15A:
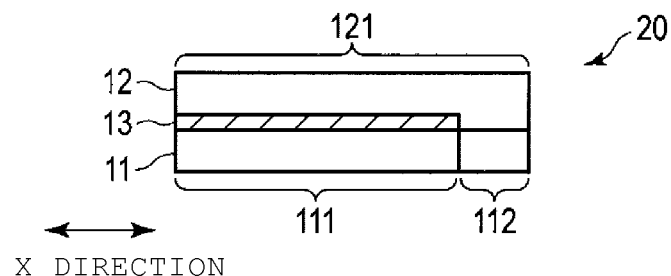
FIGS. 15A to 15C are diagrams which schematically illustrate a solid-state imaging device according to a second embodiment.
Figure 15B:
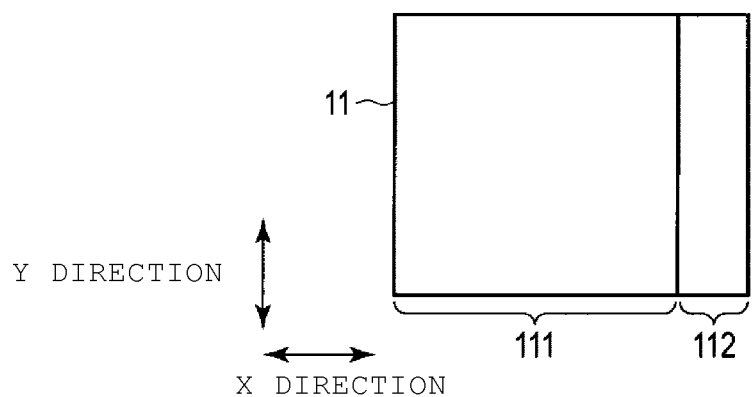
Figure 15C:
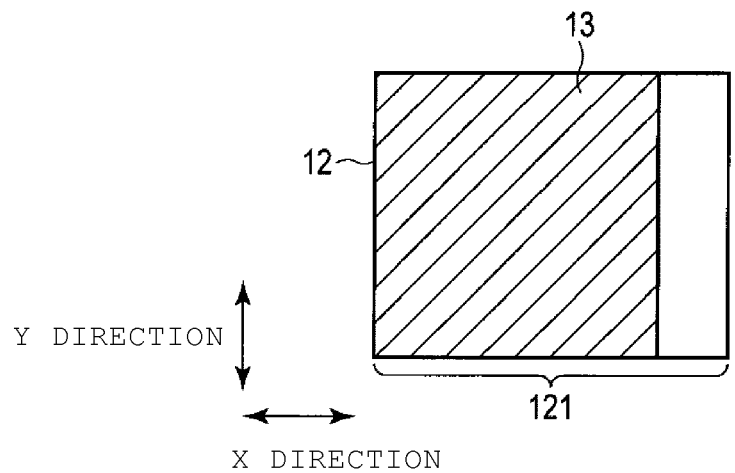

FIGS. 15A to 15C are diagrams which schematically illustrate the solid-state imaging device according to the second embodiment. FIG. 15A illustrates a cross-sectional view of the solid-state imaging device, FIG. 15B illustrates a plan view of a pixel chip, and FIG. 15C illustrates a plan view of a logic chip. In addition, the cross-sectional view which is illustrated in FIG. 15A illustrates a cross section which is aligned along the X direction.

As illustrated in FIGS. 15A to 15C, the shield layer 13 is formed in a region corresponding to the pixel region 111 on a logic circuit region 121. That is, the shield layer 13 is arranged only on the pixel region 111 on which a plurality of imaging elements are arranged. In this manner, it is possible to prevent radiation noise, or electromagnetic waves, which are generated in the logic circuit, from creating a noise disturbance in the imaging element in the pixel region 111, or the readout circuit, or to reduce the noise disturbance by arranging the shield layer 13 on the pixel region 111.

As described above, according to the second embodiment, it is possible to prevent the radiation noise, or the electromagnetic waves, which are generated by the logic circuit, from influencing the circuit elements in the pixel region by covering the pixel region, in which the imaging element and the readout circuit are formed, with a shield layer. That is, by use of the shield layer it is possible to prevent the generated noise disturbance from affecting the image signal which is generated by the pixel chip. Configurations and effects other than that are the same as the ones described above in relation to the first embodiment.

(Third Embodiment)

A solid-state imaging device according to a third embodiment will be described. According to the first embodiment, the shield layer is formed on almost the entire surface of the logic circuit region 121, however, according to the third embodiment, the shield layer 13 is formed only on or over a circuit in the logic chip 12 in which much noise occurs. The same configuration as that in the first embodiment is given the same reference numerals, and descriptions thereof will be omitted.

Figure 16A:
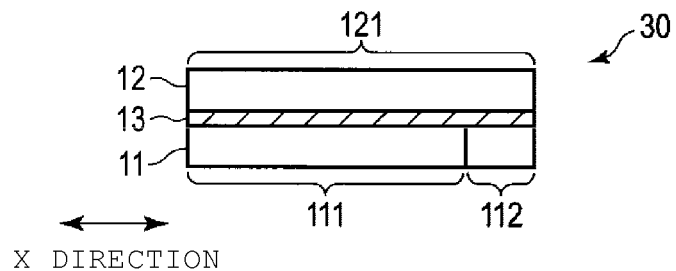
FIGS. 16A to 16D are diagrams in which a solid-state imaging device according to a third embodiment is schematically illustrated.
Figure 16B:
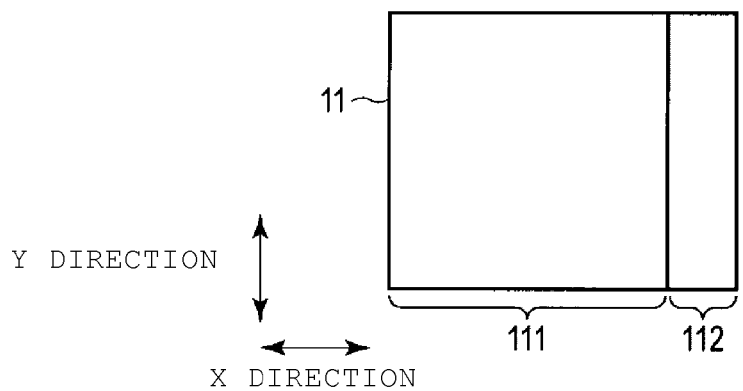
Figure 16C:
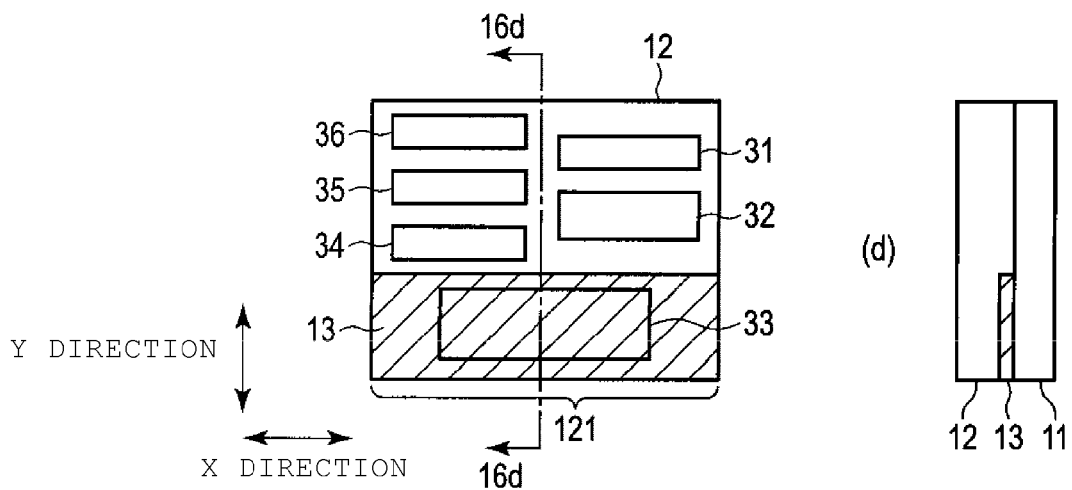
Figure 16D:
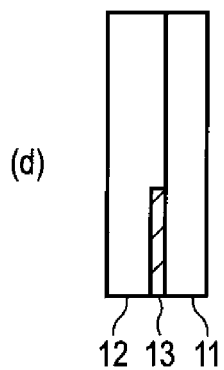

FIGS. 16A to 16D are diagrams which schematically illustrate the solid-state imaging device according to the third embodiment. FIGS. 16A and 16D illustrate cross-sectional views of the solid-state imaging device, FIG. 16B illustrates a plan view of a pixel chip, and FIG. 16C illustrates a plan view of a logic chip. The cross-sectional view which is illustrated in FIG. 16A illustrates a cross section which is aligned along the X direction, and the cross-sectional view illustrated in FIG. 16D illustrates a cross section which is aligned along line 16d-16d, which is aligned along the Y direction.

As illustrated in FIG. 16C, the logic chip 12 mainly includes the logic circuit region 121. A logic circuit which processes an image signal, which is output from the ADC 112 is formed in the logic circuit region 121.

As illustrated in FIG. 16C, the logic circuit includes, for example, a serial-parallel conversion circuit 31, a processing circuit 32, an image signal processor (hereinafter, referred to as ISP) 33, a DPCM circuit 34, a FIFO 35, and an interface 36. The serial-parallel conversion circuit 31 converts a serial signal into a parallel signal. The processing circuit 32 performs defect correction processing, and scalar and digital gain processing. The ISP 33 is a circuit which performs processing of an image signal such as white balance, a gamma correction, a color correction, or the like. The Differential Pulse Code Modulation (DPCM) circuit 34 compresses a received signal using a differential pulse code modulation. The FIFO 35 performs processing of outputting a signal earlier with respect to a signal which arrives earlier. The interface 36 Includes a D-phy (CSI-2), or an M-phy, and outputs a received signal to the outside.

Figure 17:
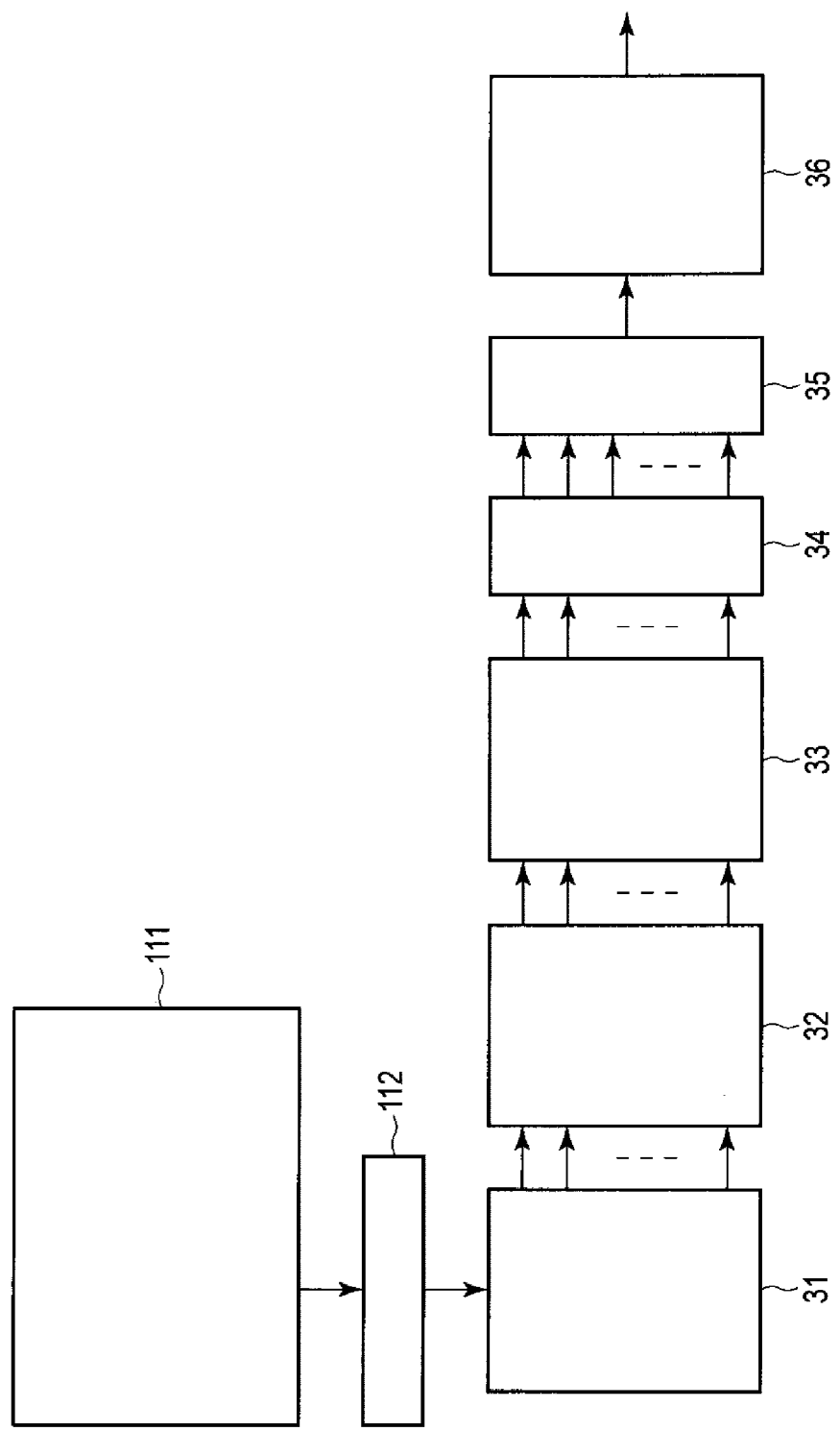
FIG. 17 is a block diagram which illustrates a flow of a signal in the solid-state imaging device according to the third embodiment.

FIG. 17 is a block diagram which illustrates a flow of a signal in the solid-state imaging device according to the third embodiment.

In the pixel region 111, input light is received, such that a photoelectric conversion is performed by the imaging element, and is read out as an image signal to the readout circuit. The image signal is converted into a digital signal from an analog signal received by the ADC 112. The image signal which is converted into the digital signal is converted into a parallel signal by the serial-parallel conversion circuit 31, and is output to the processing circuit 32. The image signal which is performed with the defect correction processing, and the scalar and digital gain processing by the processing circuit 32 is output to the ISP 33. The ISP 33 performs image processing such as the white balance, the gamma correction, the color correction, or the like with respect to the received image signal, and outputs the signal to the DPCM circuit 34. The image signal which is input to the DPCM circuit 34 is processed by the DPCM circuit 34, and is output to the outside through the FIFO 35, and the interface 36.

As illustrated in FIGS. 16A, 16B, 16C, and 16D, the shield layer 13 is formed on or over a region of the logic circuit in which the ISP 33 on the logic circuit region 121 is arranged and disposed. That is, the shield layer 13 is arranged so that the generated radiation noise, or the generated electromagnetic waves, which strongly occur in the logic circuit region 121, will not affect the signals generated in the imaging elements and other pixel related circuit elements. In one configuration, the shield layer 13 arranged on or over the ISP 33. In this manner, by arranging the shield layer 13 on or over the ISP 33, it is possible to prevent the radiation noise, or the generated electromagnetic waves which occur from the ISP 33 from causing a noise disturbance in the imaging element in the pixel region 111, or the readout circuit, or to reduce the effect of the created noise disturbance.

In addition, the shield layer 13 is arranged only on the ISP 33 here, however, it is not limited to this, and when a signal processing circuit of a high frequency (for example, 10 MHz or more), for example, a digital signal processor (hereinafter, referred to as DSP) or the like is formed in the logic circuit region 121, the shield layer 13 is arranged on or over this region, such as a DSP containing region.

As described above, according to the third embodiment, it is possible to prevent the radiation noise, or the electromagnetic waves which occur from the ISP, or the DSP from influencing the image region by covering the signal processing circuit that is operating at a high frequency, for example, a region in which the ISP, or the DSP is formed, using the shield layer. That is, it is possible to prevent the noise disturbance generated by a noise generating portion of the device, such as the logic circuit from affecting the image signal which is generated in the pixel chip. Other configurations and effects are the same as those in the first embodiment.

In the above described first to third embodiments, it is possible to provide a solid-state imaging device which is able to reduce a noise disturbance occurring in an image signal.

While certain embodiments have been described, these embodiments have been presented by way of example only, and are not intended to limit the scope of the inventions. Indeed, the novel embodiments described herein may be embodied in a variety of other forms. Furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device, comprising:
   a first multilayered wiring layer formed over a transistor which is formed on a semiconductor substrate, wherein the first multilayered wiring layer comprises:
      a first interlayer insulation film;
      a plurality of first wiring layers; and
      a plurality of wiring vias, which interconnect the plurality of first wiring layers disposed within the first interlayer insulation film;
   a first shield layer formed within the first interlayer insulation film and between two of the wiring layers;
   a second shield layer formed within the first interlayer insulation film and between two of the wiring vias;
   an imaging element; and
   a second multilayered wiring layer disposed between the imaging element and the first multilayered wiring layer, wherein the second multilayered wiring layer comprises a second interlayer insulation film, which is disposed on the first interlayer insulation film, and a plurality of second wiring layers that are disposed within the second interlayer insulation film.

2. The solid-state imaging device of claim 1, further comprising:
   a semiconductor layer formed on the second interlayer insulation film, wherein the imaging element is formed within the semiconductor layer; and
   a color filter formed on the semiconductor layer.

3. The solid-state imaging device of claim 1, wherein the first shield layer is formed between two first wiring layers.

4. The solid-state imaging device of claim 1, wherein the two or more of the wiring vias are formed at a same level within solid-state imaging device.

5. The solid-state imaging device of claim 1, wherein the first shield layer is formed at an interface between the first multilayered wiring layer and the second multilayered wiring layer.

6. The solid-state imaging device of claim 1, further comprising:
   an image signal processor formed on the semiconductor substrate, wherein the first shield layer and the second shield layer are arranged between the imaging element and the image signal processor.

7. The solid-state imaging device of claim 1, further comprising:
   a semiconductor layer formed on the second interlayer insulation film, wherein the imaging element is formed within the semiconductor layer; and
   a penetration electrode formed in the semiconductor layer and the second interlayer insulation film, and is electrically connected to one of the plurality of first wiring layers in the first multilayered wiring layer.

8. The solid-state imaging device of claim 1, wherein the transistor is formed within a logic circuit region of the semiconductor substrate, wherein the first shield layer is disposed over the logic circuit region.

9. The solid-state imaging device of claim 1, wherein the first and second shield layers are made of a material that reduces an influence by radiation type noise (EMI) on the imaging element.

10. A solid-state imaging device, comprising:
    a first multilayered wiring layer formed over a transistor formed on a semiconductor substrate, wherein the first multilayered wiring layer comprises:
       a first interlayer insulation film; and
       a plurality of first wiring layers that are disposed within the first interlayer insulation film;
    a first shield layer formed within the first interlayer insulation film;
    an imaging element; and
    a second multilayered wiring layer disposed between the imaging element and the first multilayered wiring layer, wherein the second multilayered wiring layer comprises a second interlayer insulation film, which is disposed on the first interlayer insulation film, and a plurality of second wiring layers that are disposed within the second interlayer insulation film.

11. The solid-state imaging device of claim 10, further comprising:
    a semiconductor layer formed on the second interlayer insulation film, wherein the imaging element is formed within the semiconductor layer; and
    a color filter formed on the semiconductor layer.

12. The solid-state imaging device of claim 10, wherein the first shield layer is disposed between two of the first wiring layers.

13. The solid-state imaging device of claim 12, wherein the first multilayered wiring layer further comprises one or more wiring vias that interconnect the two first wiring layers, and the first shield layer is formed around the one or more wiring vias.

14. The solid-state imaging device of claim 10, wherein the first shield layer is formed at an interface between the first multilayered wiring layer and the second multilayered wiring layer.

15. The solid-state imaging device of claim 10, further comprising:
    an image signal processor formed on the semiconductor substrate, wherein the first shield layer is arranged between the imaging element and the image signal processor.

16. The solid-state imaging device of claim 10, further comprising:
    a semiconductor layer formed on the second interlayer insulation film, wherein the imaging element is formed within the semiconductor layer; and
    a penetration electrode formed in the semiconductor layer and the second interlayer insulation film, and is electrically connected to one of the plurality of first wiring layers in the first multilayered wiring layer.

17. The solid-state imaging device of claim 10, wherein the transistor is formed within a logic circuit region of the semiconductor substrate, wherein the first shield layer is disposed over the logic circuit region.

18. The solid-state imaging device of claim 10, wherein the first and second shield layers are made of a material that reduces an influence by radiation type noise (EMI) on the imaging element.

* * * * *